(12) United States Patent
Terauchi et al.

(10) Patent No.: US 11,404,205 B2
(45) Date of Patent: Aug. 2, 2022

(54) MAGNETIC COUPLING COIL ELEMENT AND METHOD OF MANUFACTURING THE SAME

(71) Applicant: TAIYO YUDEN CO., LTD., Tokyo (JP)

(72) Inventors: Naoya Terauchi, Tokyo (JP); Takayuki Arai, Tokyo (JP); Natsuko Sato, Tokyo (JP); Atsuko Kasahara, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 599 days.

(21) Appl. No.: 16/511,848

(22) Filed: Jul. 15, 2019

(65) Prior Publication Data
US 2020/0027653 A1 Jan. 23, 2020

(30) Foreign Application Priority Data

Jul. 19, 2018 (JP) .............................. JP2018-136223

(51) Int. Cl.
| H01F 38/14 | (2006.01) |
| H01F 27/28 | (2006.01) |
| H01F 41/04 | (2006.01) |
| H05K 1/18 | (2006.01) |

(52) U.S. Cl.
CPC ......... *H01F 38/14* (2013.01); *H01F 27/2804* (2013.01); *H01F 41/041* (2013.01); *H05K 1/181* (2013.01); *H01F 2027/2809* (2013.01); *H05K 2201/1003* (2013.01)

(58) Field of Classification Search
USPC ................................. 336/177, 200, 232, 198
See application file for complete search history.

(56) References Cited

U.S. PATENT DOCUMENTS

| 2011/0181384 A1* | 7/2011 | Inuduka | ................. H01F 41/16 156/89.17 |
| 2015/0302981 A1* | 10/2015 | Kaneko | ................. H01F 27/346 336/207 |
| 2016/0078997 A1* | 3/2016 | Son | .................... H01F 17/0013 174/260 |

FOREIGN PATENT DOCUMENTS

| JP | 2005-064321 A | 3/2005 |
| JP | 2016-131208 A | 7/2016 |

* cited by examiner

*Primary Examiner* — Shawki S Ismail
*Assistant Examiner* — Kazi S Hossain
(74) *Attorney, Agent, or Firm* — Pillsbury, Winthrop, Shaw, Pittman, LLP

(57) ABSTRACT

A magnetic coupling coil element in one embodiment includes a magnetic base body that includes an intermediate magnetic layer, a first magnetic layer disposed over the intermediate magnetic layer, and a second magnetic layer disposed under the intermediate magnetic layer; a first coil conductor provided in the first magnetic layer; and a second coil conductor provided in the second magnetic layer. The intermediate magnetic layer has a saturation magnetic flux density lower than saturation magnetic flux densities of the first magnetic layer and the second magnetic layer in a first region that overlaps with the first coil conductor and the second coil conductor in plan view.

9 Claims, 5 Drawing Sheets

MAGNETIC COUPLING COIL ELEMENT AND METHOD OF MANUFACTURING THE SAME

CROSS-REFERENCE TO RELATED APPLICATIONS

This application is based on and claims the benefit of priority from Japanese Patent Application Serial No. 2018-136223 (filed on Jul. 19, 2018), the contents of which are hereby incorporated by reference in its entirety.

TECHNICAL FIELD

The present disclosure relates to a magnetic coupling coil element and a manufacturing method thereof. The present disclosure further relates to a circuit board provided with a magnetic coupling coil element and an electronic device provided with the same.

BACKGROUND

A magnetic coupling coil component includes a pair of coil conductors magnetically coupled to each other. Examples of magnetic coupling coil element include a choke coil, a transformer, and a coupled inductor.

Magnetic coupling choke coils are widely used in chopper DC-DC converters. When an output current is changed by turning on/off a load connected to a DC-DC converter, the output voltage instantaneously fluctuates greatly and then returns to a steady state. If the voltage fluctuation in this transient state becomes too large, there is a possibility that a circuit connected to the DC-DC converter may be broken or malfunction. Further, when the voltage fluctuation in the transient state becomes large, a transient response time until the output voltage returns to the steady state becomes very long. In a chopper type DC-DC converter, the fluctuation of the output voltage can be reduced by increasing a coupling coefficient of the choke coil.

Thus, a magnetic coupling coil element typically has a high coupling between a pair of coil conductors. Various methods have been proposed to increase the coupling coefficient of the magnetic coupling coil element. For example, Japanese Patent Application Publication No. 2016-131208 describes that a pair of coil conductors embedded in a magnetic base body is provided such that the coil conductors are situated in close contact with each other and their coil winding axes are substantially coincident with each other. Japanese Patent Application Publication No. 2005-064321 discloses a magnetic coupling coil element in which a spacer having a magnetic permeability smaller than that of a magnetic base body is provided between a pair of coil conductors embedded in the magnetic base body (magnetic core 11). The spacer enhances the coupling between the pair of coil conductors.

A large direct current may run through a magnetic coupling coil element. For example, it is assumed that a large current flows through a choke coil used in a DC-DC converter. When a direct current flows through coil conductors constituting the choke coil, the permeability of the magnetic base body of the choke coil changes. As a result, a self-inductance of each of the pair of coil conductors constituting the choke coil and a mutual inductance between the pair of coil conductors are changed.

The coupling coefficient representing the strength of coupling between a first coil conductor and a second coil conductor is given by the following equation, and depends on a self-inductance $L_1$ of the first coil conductor, a self-inductance $L_2$ of the second coil conductor, and a mutual inductance M between the first and second coil conductors.

[Formula 1]

$$k = \frac{M}{\sqrt{L_1 L_2}} \qquad \text{(Formula 1)}$$

In Formula 1, "k" is the coupling coefficient, "$L_1$" is the self-inductance of the first coil conductor, "$L_2$" is the self-inductance of the second coil conductor, and "M" is the mutual inductance.

Therefore, the coupling coefficient between the pair of coil conductors changes in accordance with the magnitude of the current applied to each coil conductor. However, for conventional magnetic coupling coil elements, sufficient study has not been conducted on the change of coupling coefficient caused by the change of the magnitude of direct current flowing through each coil conductor.

In a magnetic coupling choke coil used in a chopper type DC-DC converter, the fluctuation of the output voltage can be further suppressed if the coupling coefficient can be made high when the current is applied. Thus, depending on the application, it is desired to use a magnetic coupling coil element whose coupling coefficient becomes high when current is applied.

SUMMARY

One object of the present invention is to provide a magnetic coupling coil element whose coupling coefficient increases due to a current applied to the coil conductors. Other objects of the present invention will be made apparent through description in the entire specification.

A magnetic coupling coil element according to one aspect of the invention includes a magnetic base body that includes an intermediate magnetic layer, a first magnetic layer disposed over the intermediate magnetic layer, and a second magnetic layer disposed under the intermediate magnetic layer; a first coil conductor provided in the first magnetic layer; and a second coil conductor provided in the second magnetic layer. The intermediate magnetic layer has a saturation magnetic flux density lower than saturation magnetic flux densities of the first magnetic layer and the second magnetic layer in a first region that overlaps with the first coil conductor and the second coil conductor in plan view.

In the magnetic coupling coil element, the intermediate magnetic layer may have a lower iron content in the first region than the first magnetic layer and the second magnetic layer.

In the magnetic coupling coil element, the intermediate magnetic layer may have a saturation magnetic flux density lower than saturation magnetic flux densities of the first magnetic layer and the second magnetic layer also in a second region different from the first region.

In the magnetic coupling coil element, the intermediate magnetic layer may have a lower iron content in the second region than the first magnetic layer and the second magnetic layer.

The magnetic coupling coil element may further includes a first cover layer disposed over the first magnetic layer and a second cover layer disposed under the second magnetic layer. The intermediate magnetic layer has a saturation magnetic flux density lower than saturation magnetic flux densities of the first cover layer and the second cover layer in the first region that overlaps with the first coil conductor and the second coil conductor in plan view.

A circuit board according to another aspect of the invention includes the magnetic coupling coil element mounted thereon.

An electronic device according to another aspect of the invention includes the circuit board.

Yet another aspect of the invention relates to a method of manufacturing the magnetic coupling coil element.

In the manufacturing method, the first magnetic layer and the second magnetic layer are both formed by a lamination process.

According to the aspect of the invention, it is possible to increase the coupling coefficient of the magnetic coupling coil element through the current applied to the coil conductor.

DESCRIPTION OF THE PREFERRED EMBODIMENTS

The following describes various embodiments of the present invention with reference to the drawings as appropriate. Constituent elements common to a plurality of drawings are denoted by the same reference signs throughout the plurality of drawings. It should be noted that the drawings do not necessarily appear to an accurate scale for the sake of convenience of explanation.

Figure 1:
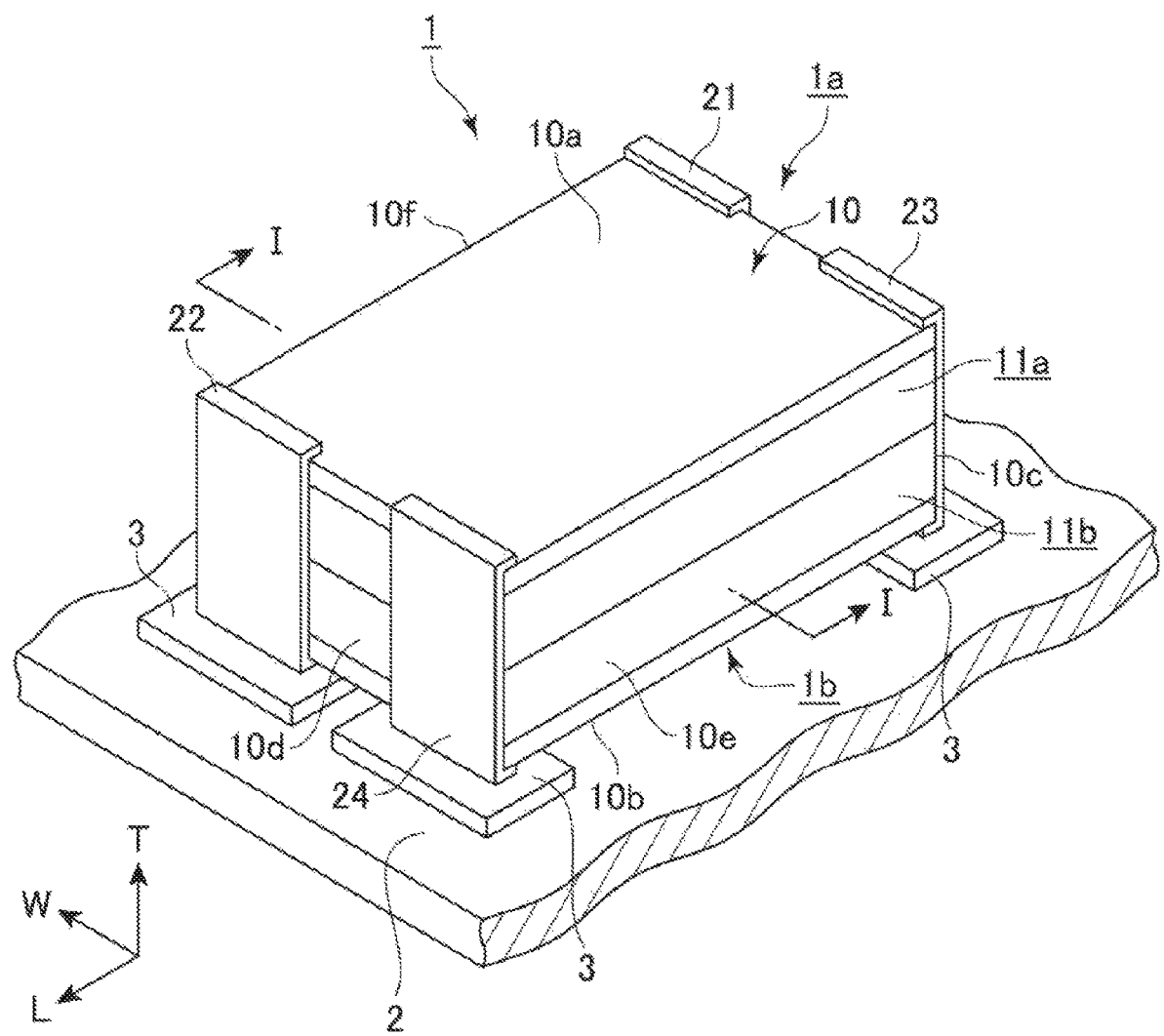
FIG. 1 is a perspective view of a magnetic coupling coil element according to one embodiment of the present invention.
Figure 2:
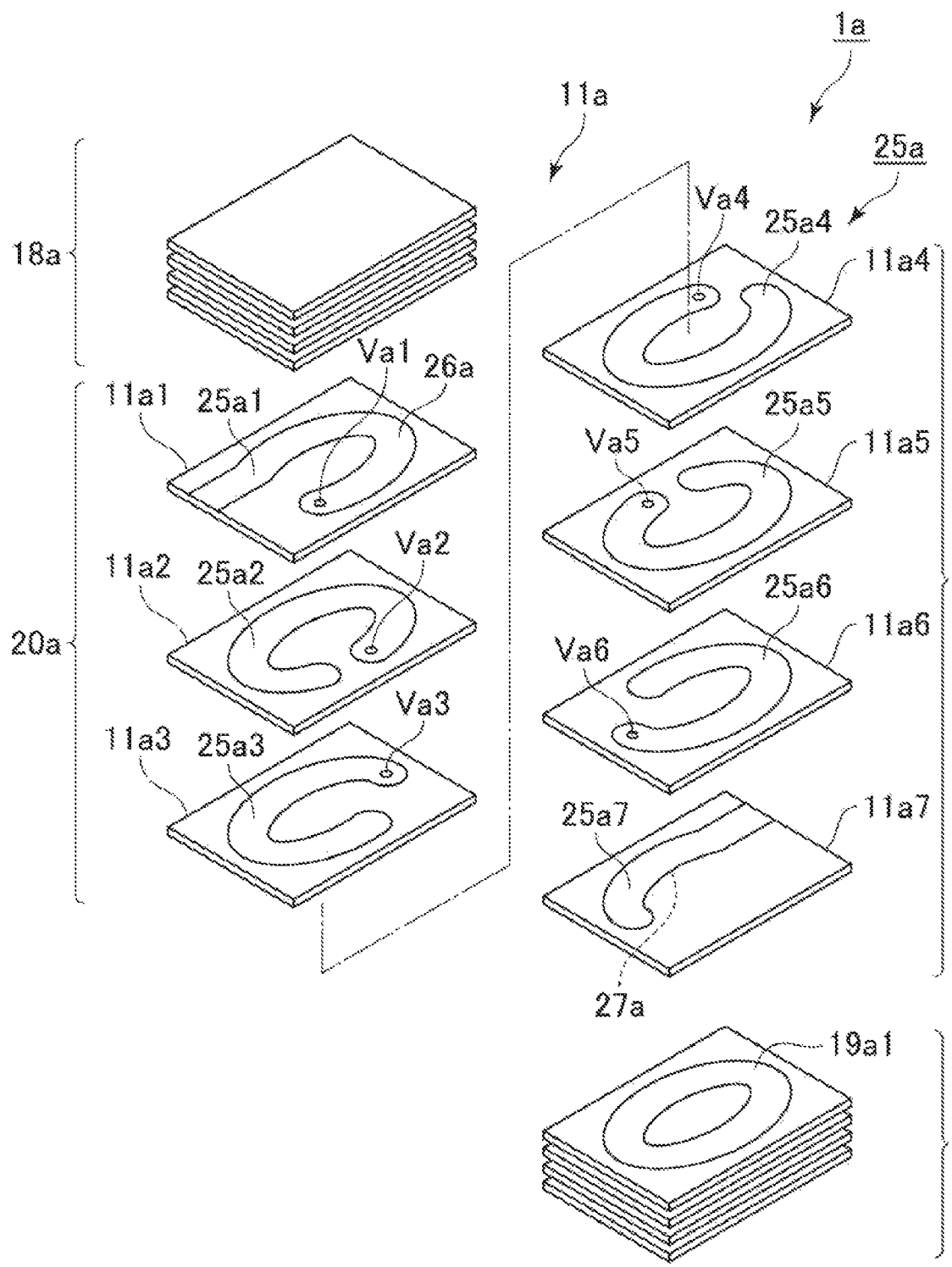
FIG. 2 is an exploded perspective view of one of two coil units included in the magnetic coupling coil element of FIG. 1.
Figure 3:
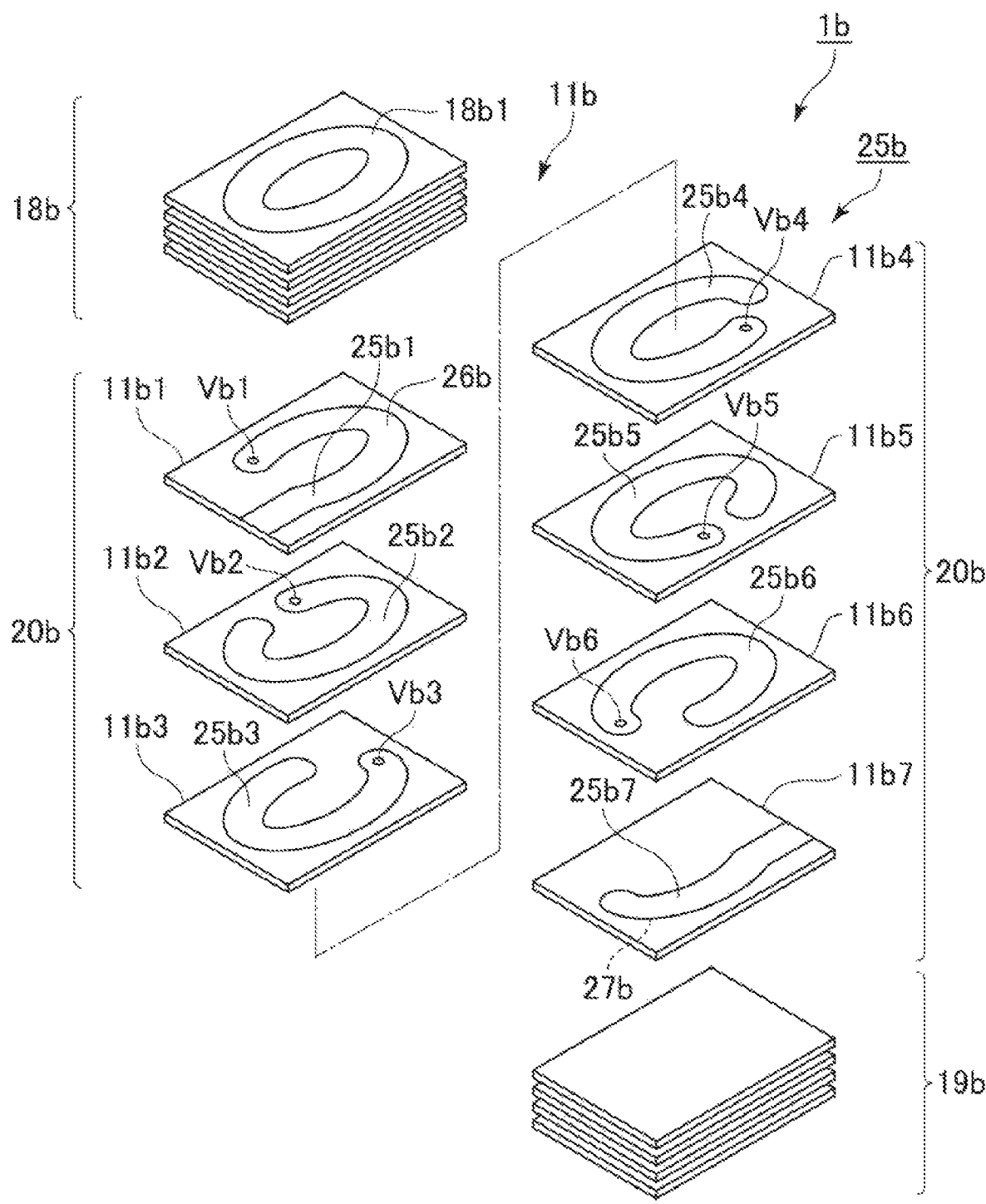
FIG. 3 is an exploded perspective view of the other of the two coil units included in the magnetic coupling coil element of FIG. 1.
Figure 4:
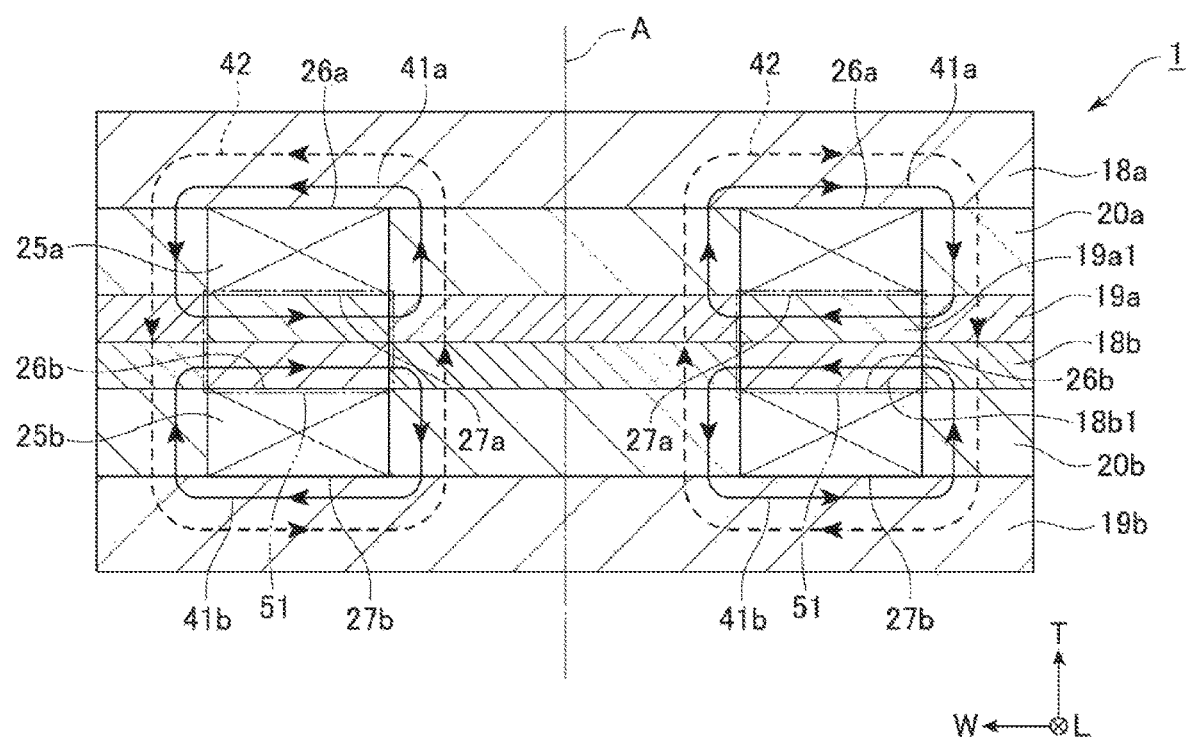
FIG. 4 is a schematic sectional view of the magnetic coupling coil element of FIG. 1 along the line I-I (TW section).

A magnetic coupling coil element 1 according to one embodiment of the invention will be hereinafter described with reference to FIGS. 1 to 4. FIG. 1 is a perspective view of the magnetic coupling coil element 1 according to one embodiment of the invention, FIG. 2 is an exploded perspective view of a coil unit 1a included in the magnetic coupling coil element 1 of FIG. 1, FIG. 3 is an exploded perspective view of a coil unit 1b included in the magnetic coupling coil element 1 of FIG. 1, and FIG. 4 is a schematic sectional view of the magnetic coupling coil element of FIG. 1 along the line I-I. In FIGS. 2 and 4, external electrodes are omitted for convenience of description.

In this specification, a "length" direction, a "width" direction, and a "thickness" direction of the magnetic coupling coil element 1 are referred to as an "L" axis direction, a "W" axis direction, and a "T" axis direction in FIG. 1, respectively, unless otherwise construed from the context.

The drawings illustrate a choke coil used for a DC-DC converter as an example of the magnetic coupling coil element 1. A choke coil used in a DC-DC converter is an example of a magnetic coupling coil element to which the present invention can be applied. The choke coil used in a DC-DC converter is manufactured by a lamination process or a thin film process as described later. In addition to choke coils for DC-DC converters, the invention can be applied to transformers, coupled inductors, and various other magnetic coupling coil elements.

As shown, the magnetic coupling coil element 1 in one embodiment of the invention includes the coil unit 1a and the coil unit 1b. The magnetic coupling coil element 1 is configured to magnetically couple a coil conductor 25a of the coil unit 1a and a coil conductor 25b of the coil unit 1b. The coil conductor 25a and the coil conductor 25b will be described later.

The coil unit 1a includes an upper magnetic base body 11a, a coil conductor 25a embedded in the upper magnetic base body 11a, an external electrode 21 electrically connected to one end of the coil conductor 25a, and an external electrode 22 electrically connected to the other end of the coil conductor 25a.

The upper magnetic base body 11a includes an upper magnetic layer 20a formed in a rectangular parallelepiped shape from a magnetic material, a upper cover layer 18a made of a magnetic material provided on the upper surface of the upper magnetic layer 20a, and a lower cover layer 19a made of a magnetic material provided on the lower surface of the upper magnetic layer 20a. The boundary between the upper magnetic layer 20a and the upper cover layer 18a and the boundary between the upper magnetic layer 20a and the lower cover layer 19a may not be clearly identified depending on the manufacturing method used to fabricate the coil unit 1a. The upper magnetic layer 20a is an example of a first magnetic layer, and the coil conductor 25a is an example of a first coil conductor. The upper cover layer 18a is an example of a first cover layer.

The coil unit 1b is configured in the same manner as the coil unit 1a. More specifically, the coil unit 1 includes a lower magnetic base body 11b, a coil conductor 25b embedded in the lower magnetic base body 11b, an external electrode 23 electrically connected to one end of the coil conductor 25b, and an external electrode 24 electrically connected 25 the other end of the coil conductor 25b.

The lower magnetic base body 11b includes a lower magnetic layer 20b formed in a rectangular parallelepiped shape from a magnetic material, an upper cover layer 18a made of a magnetic material provided on the upper surface of the lower magnetic layer 20b, and a lower cover layer 19b made of a magnetic material provided on the lower surface of the lower magnetic layer 20b. The boundary between the lower magnetic layer 20b and the upper cover layer 18b and the boundary between the lower magnetic layer 20b and the lower cover layer 19b may not be clearly identified depending on the manufacturing method used to fabricate the coil unit 1b. The lower magnetic layer 20b is an example of a second magnetic layer, and the coil conductor 25b is an example of a second coil conductor. The lower cover layer 19b is an example of a second cover layer.

The magnetic coupling coil element 1 is mounted on a circuit board 2. A landing portion 3 may be provided on the circuit board 2. In the case where the magnetic coupling coil element 1 includes the four external electrodes 21 to 24, the circuit board 2 is provided with the four landing portions 3 correspondingly. The magnetically coupling coil element 1 may be mounted on the circuit board 2 by bonding each of the external electrodes 21 to 24 to the corresponding land portions 3 of the circuit board 2. The circuit board 2 can be mounted in various electronic devices.

A bottom surface of the upper magnetic base body 11a is bonded to a top surface of the lower magnetic base body 11b. The upper magnetic base body 11a and the lower magnetic base member 11b form a magnetic base body 10.

The magnetic base body 10 has a first principal surface 10a, a second principal surface 10b, a first end surface 10c, a second end surface 10d, a first side surface 10e, and a second side surface 10f. The outer surface of the magnetic base body 10 may be defined by these six surfaces. The first principal surface 10a and the second principal surface 10b are opposed to each other, the first end surface 10c and the second end surface 10d are opposed to each other, and the first side surface 10e and the second side surface 10f are opposed to each other.

In FIG. 1, the first principal surface 10a lies on the top side of the magnetic base body 10, and therefore, the first principal surface 10a may be herein referred to as "the top surface." Similarly, the second principal surface 10b may be referred to as "the bottom surface." The magnetic coupling coil element 1 is disposed such that the second principal surface 10b faces the circuit board 2, and therefore, the second principal surface 10b may be herein referred to as "the mounting surface." The top-bottom direction of the magnetic coupling coil element 1 refers to the top-bottom direction in FIG. 1.

The external electrode 21 and the external electrode 23 are provided on the first end surface 10c of the magnetic base body 10. The external electrode 22 and the external electrode 24 are provided on the second end surface 10d of the magnetic base body 10. As shown, these external electrodes extend to the top surface and the bottom surface of the magnetic base body 10. The shapes and arrangements of the external electrodes are not limited to the illustrated embodiment. For example, all of the external electrodes 21 to 24 may be provided on the bottom surface 10b of the magnetic base body 10. In this case, the coil conductor 25a and the coil conductor 25b are connected to the external electrodes 21 to 24 on the bottom surface 10b of the magnetic base body 10 through via conductors.

As described above, the magnetic base body 10 is made of a magnetic material. The magnetic coupling coil element 1 may have two or more regions made of different magnetic materials. For example, the upper magnetic layer 20a and the lower magnetic layer 20b may be formed of different magnetic materials from each other. An element or portion made of a nonmagnetic material may be provided inside or outside the magnetic base body 10. The element or portion made of the nonmagnetic material is not a part of the magnetic base body 10.

Next, with reference to FIGS. 2 and 3, a further description is given of the coil units 1a and 1b. FIGS. 2 and 3 illustrate the coil unit 1a and the coil unit 1b that are fabricated through a lamination process. As shown in FIG. 2, the upper magnetic layer 20a provided in the coil unit 1a includes magnetic films 11a1 to 11a7. In the upper magnetic layer 20a, the magnetic film 11a1, the magnetic film 11a2, the magnetic film 11a3, the magnetic film 11a4, the magnetic film 11a5, the magnetic film 11a6, and the magnetic film 11a7 are laminated in a direction from a positive side to a negative side of the T axis. As shown in FIG. 3, the lower magnetic layer 20b provided in the coil unit 1b includes magnetic films 11b1 to 11b7. In the lower magnetic layer 20b, the magnetic film 11b1, the magnetic film 11b2, the magnetic film 11b3, the magnetic film 11b4, the magnetic film 11b5, the magnetic film 11b6, and the magnetic film 11b7 are laminated in the direction from the positive side to the negative side of the T axis. The coil unit 1a and the coil unit 1b may be fabricated by a method other than the lamination process. The coil unit 1a and the coil unit 1b may each be, for example, a winding type coil in which windings are wound around a core. The coil unit 1a and the coil unit 1b may each be a coil unit fabricated through a thin film process.

Conductive patterns 25a1 to 25a7 are formed on upper surfaces of the magnetic films 11a1 to 11a7, and conductive patterns 25b1 to 25b7 are formed on upper surfaces of the magnetic films 11b1 to 11b7. The conductive patterns 25a1 to 25a7 and the conductive patterns 25b1 to 25b7 are formed by, for example, applying a conductive paste made of a metal or alloy having an excellent electrical conductivity by screen printing. The conductive paste may be made of Ag, Pd, Cu, Al, or an alloy thereof. The conductive patterns 25a1 to 25a7 may be formed by other methods using other materials. The conductive patterns 25a1 to 25a7 and the conductive patterns 25b1 to 25b7 may be formed by, for example, a sputtering method, an inkjet method, or any other known method.

The magnetic films 11a1 to 11a7 are provided with vias Va1 to Va6, respectively, at predetermined positions therein. The vias Va1 to Va6 are formed by forming through-holes at the predetermined positions in the magnetic films 11a1 to 11a7 so as to extend through the magnetic films 11a1 to 11a7 in the T axis direction and filling a conductive material into the through-holes.

Each of the conductive patterns 25a1 to 25a7 is electrically connected to adjacent ones via the vias Va1 to Va6. The conductive patterns 25a1 to 25a7 connected in this manner form a coil conductor 25a having a spiral shape. In other words, the coil conductor 25a includes the conductor patterns 25a1 to 25a7 and the vias Va1 to Va6.

The end of the conductive pattern 25a1 opposite to the other end connected to the via Va1 is connected to the external electrode 22. The end of the conductive pattern 25a7 opposite to the other end connected to the via Va6 is connected to the external electrode 21.

The coil conductor 25a has an upper coil surface 26a and a lower coil surface 27a, the upper coil surface 26a serves as one end of the coil conductor 25a in the T axis direction and the lower coil surface 27a serves as the other end of the coil conductor 25a in the T axis direction. In one embodiment, the upper coil surface 26a is provided such that it flushes with the upper surface of the upper magnetic layer 20a. In one embodiment, the lower coil surface 27a is provided such that it flushes with the lower surface of the upper magnetic layer 20a.

The magnetic films 11b1 to 11b7 are provided with vias Vb1 to Vb6, respectively, at predetermined positions therein. The vias Vb1 to Vb6 are formed by forming through-holes at the predetermined positions in the magnetic films 11b1 to 11b7 so as to extend through the magnetic films 11b1 to 11b7 in the T axis direction and filling a conductive material into the through-holes.

Each of the conductive patterns 25b1 to 25b7 is electrically connected to adjacent ones via the vias Vb1 to Vb6. The conductive patterns 25b1 to 25b7 connected in this manner form the coil conductor 25b that has a spiral shape. In other words, the coil conductor 25b includes the conductive patterns 25b1 to 25b7 and the vias Vb1 to Vb6.

The end of the conductive pattern 25b1 opposite to the other end connected to the via Vb1 is connected to the external electrode 24. The end of the conductive pattern 25b7 opposite to the other end connected to the via Vb6 is connected to the external electrode 23.

The coil conductor 25b has a upper coil surface 26b and a lower coil surface 27b, the upper coil surface 26b serves as one end of the coil conductor 25b in the T axis direction and the lower coil surface 27b serves as the other end of the coil conductor 25b in the T axis direction. The coil conductor 25a is disposed such that the lower coil surface 27a thereof is opposed to the upper coil surface 26b of the coil conductor 25b. In one embodiment, the upper coil surface 26b is provided such that it flushes with the upper surface of the lower magnetic layer 20b. In one embodiment, the lower coil surface 27b is provided such that it flushes with the lower surface of the lower magnetic layer 20b.

The upper cover layer 18a and the lower cover layer 19a of the upper magnetic base body 11a, and the upper cover layer 18b and the lower cover layer 19b of the lower magnetic base body 11b each have a laminated body of insulating films. The insulating films constituting the upper cover layer 18a and the lower cover layer 19a of the upper magnetic base body 11a and the upper cover layer 18b and the lower cover layer 19b of the lower magnetic base body 11b may also be referred to as "cover layer insulating films."

The magnetic films 11a1 to 11a7, the magnetic films 11b1 to 11b7, and the cover layer insulating films are made of a magnetic material(s). Ferrite material, particles of soft magnetic metal or soft magnetic alloy, a composite material in which a large number of filler particles made of magnetic material are dispersed in resin, or any known magnetic material other than these may be used as a magnetic material(s) for the magnetic films 11a1 to 11a7, the magnetic films 11b1 to 11b7, and the cover layer insulating films. An insulating film made of an insulating material having an excellent insulation property is formed on each of the particles of the soft magnetic metal or soft magnetic alloy.

Ferrite material such as Ni—Zn based ferrite, Ni—Zn—Cu based ferrite, Mn—Zn based ferrite, or any other ferrites may be used as the material for the magnetic films 11a1 to 11a7, the magnetic films 11b1 to 11b7, and the cover layer insulating films.

The soft magnetic metal used as the material for the magnetic films 11a1 to 11a7, the magnetic films 11b1 to 11b7, and the cover layer insulating films may be selected from one or more soft magnetic metals of the group consisting of Fe, Ni, and Co or any other soft magnetic metal.

Soft magnetic alloy such as Fe—Si based alloy, Fe—Ni based alloy, Fe—Co based alloy, Fe—Cr—Si based alloy, Fe—Si—Al based alloy, and Fe—Si—B—Cr based alloy, or any other soft magnetic alloy may be used as the material for the magnetic films 11a1 to 11a7, the magnetic films 11b1 to 11b7, and the cover layer insulating films.

When the magnetic films 11a1 to 11a7, the magnetic films 11b1 to 11b7, and the cover layer insulating films are formed of a composite material in which a large number of filler particles are dispersed in resin, examples of such a resin may include an epoxy resin, a polyimide resin, a polystyrene (PS) resin, a high-density polyethylene (HDPE) resin, a polyoxymethylene (POM) resin, a polycarbonate (PC) resin, a polyvinylidene fluoride (PVDF) resin, a phenolic resin, a polytetrafluoroethylene (PTFE) resin, or a polybenzoxazole (PBO) resin. As the filler particles, particles of ferrite material, metal magnetic particles, or any other known filler particles can be used. Particles of a ferrite material applicable to the present invention are, for example, particles of Ni—Zn ferrite or particles of Ni—Zn—Cu ferrite. Metal magnetic particles applicable to the present invention may include particles of, for example, (1) Fe or Ni; (2) Fe—Si—Cr based alloy, Fe—Si—Al based alloy, or Fe—Ni alloy; (3) Fe—Si—Cr—B—C amorphous alloy, or Fe—Si—B—Cr amorphous alloy; or (4) a material of any combination thereof.

The magnetic films constituting the magnetic films 11a1 to 11a7, the upper cover layer 18a, the lower cover layer 19a, the magnetic films 11b1 to 11b7, the upper cover layer 18b, and the lower cover layer 19b may be entirely formed of the ferrite material, the soft magnetic metal material or the soft magnetic alloy material, or the composite material in which a large number of filler particles are dispersed in resin. Some of the magnetic films constituting the magnetic films 11a1 to 11a7, the upper cover layer 18a, the lower cover layer 19a, the magnetic films 11b1 to 11b7, the upper cover layer 18b, and the lower cover layer 19b may be formed of a different material from that of the other of the magnetic films.

In one embodiment, the lower cover layer 19a includes an annular portion 19a1 having an annular shape in plan view. The shape of the annular portion 19a1 corresponds to the plane shape of the coil conductor 25a in plan view. For example, the coil conductor 25a has a spiral shape formed by connecting the conductive patterns 25a1 to 25a7 via the vias Va1 to Va6, the spiral shape appearing nearly oval in plan view. In this case, the annular portion 19a1 has an oval shape that corresponds to the shape of the coil conductor 25a in plan view. The annular portion 19a1 is positioned inside the outline of the plane shape of the coil conductor 25a in plan view. For example, the annular portion 19a1 has an oval shape with a long axis and a short axis slightly shorter than those of the oval defining the outline of the coil conductor 25a.

In one embodiment, the upper cover layer 18b includes an annular portion 18b1 having an annular shape in plan view. The shape of the annular portion 18b1 corresponds to the plane shape of the coil conductor 25b in plan view. For example, the coil conductor 25b has a spiral shape formed by connecting the conductive patterns 25b1 to 25b7 through the vias Vb1 to Vb6, and the spiral shape appears substantially oval in plan view. In this case, the annular portion 18b1 has an oval shape that corresponds to the shape of the coil conductor 25b in plan view. The annular portion 18b1 is positioned inside the outline of the plane shape of the coil conductor 25b in plan view. For example, the annular portion 18b1 has an oval shape with a long axis and a short axis slightly shorter than those of the oval defining the outline of the coil conductor 25b.

The annular portion 19a1 and the annular portion 18b1 are formed of a magnetic material having a saturation magnetic flux density lower than that of regions of the magnetic base body 10 other than the annular portion 19a1 and the annular portion 18b1 (that is, the regions including the upper cover layer 18a, the upper magnetic layer 20a, the region of the lower cover layer 19a other than the annular portion 19a1, the region of the upper cover layer 18b other than the annular portion 18b1, the lower magnetic layer 20b, and the lower cover layer 19a). Thus, the annular portion 19a1 and the annular portion 18b1 have lower saturation magnetic flux densities in the magnetic base body 10 than the regions other than the annular portion 19a1 and the annular portion 18b1.

In one embodiment, all of the constituent parts of the magnetic base body 10 include particles of a Fe-containing soft magnetic alloy. Thus, the annular portion 19a1 and the annular portion 18b1 are configured such that the mass content of iron is lower than that of the regions other than the annular portion 19a1 and the annular portion 18b1 of the magnetic base body 10. For example, when the magnetic base body 10 is formed of a magnetic material containing particles of an Fe—Si based alloy, a mass Fe content of Fe—Si alloy used in the annular portion 19a1 and the annular portion 18b1 is smaller than a mass Fe content of Fe—Si alloy used in the regions other than the annular portion 19a1 and the annular portion 18b1 of the magnetic base body 10. To determine which of the two regions of the magnetic base body 10 has a larger or smaller mass content, influences of the constituents (for example, the binder) of the magnetic base body 10 other than the soft magnetic alloy particles is ignored and the iron mass contents of the soft magnetic alloy particles contained in the target two regions can be compared to each other. As described above, the saturation magnetic flux density of the annular portion 19a1 and the annular portion 18b1 can be lowered relative to the saturation magnetic flux density of the regions other than the annular portion 19a1 and the annular portion 18b1 of the magnetic base body 10 by setting the iron content in the annular portion 19a1 and the annular portion 18b1 lower than that of the regions of the magnetic base body 10 other than the annular portion 19a1 and the annular portion 18b1.

The higher the iron content of a soft magnetic alloy containing iron, in general, the higher the saturation magnetic flux density generated from the soft magnetic alloy. Therefore, as described above, the saturation magnetic flux density of the annular portion 19a1 and the annular portion 18b1 can be lowered relative to the saturation magnetic flux density of the regions other than the annular portion 19a1 and the annular portion 18b1 of the magnetic base body 10 by setting the iron mass content of the annular portion 19a1 and the annular portion 18b1 lower than that of the regions of the magnetic base body 10 other than the annular portion 19a1 and the annular portion 18b1. Alternatively, the saturation magnetic flux density of the annular portion 19a1 and the annular portion 18b1 may be adjusted by changing parameters other than the Fe content.

The magnetic coupling coil element 1 includes a first coil conductor (the coil conductor 25a) and a second coil conductor (the coil conductor 25b), the first coil conductor is situated between the external electrode 21 and the external electrode 22, and the second coil conductor is situated between the external electrode 23 and the external electrode 24. These two coils are respectively connected to, for example, two power wires of a power circuit used as a DC-DC converter. In this case, the magnetic coupling coil element 1 can operate as a choke coil in the DC-DC converter.

The magnetic coupling coil element 1 may include a third coil (not shown). The magnetic coupling coil element 1 having the third coil additionally includes another coil unit configured in the same manner as the coil unit 1a. As with the coil unit 1a and the coil unit 1b, the additional coil unit includes a coil conductor that is connected to additional external electrodes. Such a magnetic coupling coil element including the three coils may be used, for example, as a coupled inductor in a multiphase DC-DC converter.

Next, with reference to FIG. 4, a further description is given of a coupling coefficient between the coil conductor 25a and the coil conductor 25b in the magnetic coupling coil element 1. FIG. 4 is a schematic sectional view of the magnetic coupling coil element of FIG. 1 along the line I-I (TW section). In FIG. 4, the magnetic flux (the lines of magnetic force) generated from the coil conductor is represented by arrows. In FIG. 4, the boundaries between the individual insulating layers are omitted for convenience of description.

As shown in FIG. 4, the coil conductor 25a is provided in the upper magnetic layer 20a such that the upper coil surface 26a is in contact with the upper cover layer 18a and the lower coil surface 27a is in contact with the lower cover layer 19a. The coil conductor 25a is wound around a coil axis A in the upper magnetic layer 20a. The coil axis A is an imaginary line that extends in parallel to the axis T in FIG. 1. Alternatively, the coil axis A may be disposed perpendicular to the T axis. The coil conductor 25b is provided in the lower magnetic layer 20b such that the upper coil surface 26a is in contact with the upper cover layer 18b and the lower coil surface 27b is in contact with the lower cover layer 19b. The coil conductor 25b is wound around the coil axis A in the same manner as 25a.

The lower cover layer 19a and the upper cover layer 18b are provided between the upper magnetic layer 20a and the lower magnetic layer 20b. The lower cover layer 19a and the upper cover layer 18b may be herein collectively referred to as an intermediate magnetic layer. The upper magnetic layer 20a is provided over the intermediate magnetic layer, and the lower magnetic layer 20b is provided under the intermediate magnetic layer.

The annular portion 19a1 and the annular portion 18b1 are both provided in the intermediate magnetic layer. The region in the intermediate magnetic layer where the annular portion 19a1 and the annular portion 18b1 exist may be herein collectively referred to as a first region 51 of the intermediate magnetic layer. The first region 51 in the intermediate magnetic layer is an annular region that overlaps with the coil conductor 25a and the coil conductor 25b in plan view.

When the magnetic coupling coil element 1 is used, current flows in the coil conductor 25a and the coil conductor 25b. In the embodiment of FIG. 4, a current flows from the external electrode 21 to the external electrode 22 in the coil conductor 25a, and a current flows from the external electrode 23 to the external electrode 24 in the coil conductor 25b. When current flows in the coil conductor 25a and the coil 25b, a magnetic flux 41a interlinked with the coil conductor 25a, a magnetic flux 41b interlinked with the coil conductor 25b, and a magnetic flux 42 interlinked with both the coil conductor 25a and the coil conductor 25b are generated. In FIG. 4, in order to easily distinguish between the magnetic flux interlinked with the coil conductor 25a, the magnetic flux interlinked with the coil conductor 25b, and the magnetic flux interlinked with both of the coil conductor 25b, the magnetic flux 41a, the magnetic flux 41b, and the magnetic flux 42 are drawn separately from each other. However, this is for the convenience of description, and the actual magnetic flux in each region of the magnetic base body 11 is determined by adding the magnetic fluxes generated by the current flowing through each of the coil conductor 25a and the coil conductor 25b. In the illustrated embodiment, the magnetic flux 41a represents a magnetic flux interlinked with the coil conductor 25a but not interlinked with the coil conductor 25b, and the magnetic flux 41b represents a magnetic flux interlinked with the coil conductor 25b but not interlinked with the coil conductor 25a. The direction of the magnetic flux 42 changes depending on the amount of current flowing through the coil conductor 25a and the coil conductor 25b. FIG. 4 illustrates the case where the amount of current flowing through the coil conductor 25a is larger than the amount of current flowing through the coil conductor 25b and the direction of the magnetic flux 42 is indicated by the arrow. As used herein, the term "interlinked" is used in accordance with its ordinary and customary meaning in the art of the present invention. That is, "interlinked" means that two closed curves pass through each other like a chain.

When current flows in both the coil conductor 25a and the coil conductor 25b, the magnetic flux 41a, the magnetic flux 41b and the magnetic flux 42 are generated as described above. These magnetic fluxes contribute to a self inductance L1, a self inductance L2 and a mutual inductance M, respectively. When the applied current is increased, magnetic saturation increases in each region of the magnetic base body 11, and the self inductance L1, the self inductance L2 and the mutual inductance M decrease. In particular, in the inter-coil region 51 between the coil conductor 25a and the coil conductor 25b, the magnetic flux 41a and the magnetic flux 41b enhance each other, so that magnetic saturation tends to advance. Consequently the self inductance L1 and the self inductance L2 decrease. It would be understood from the definition of the coupling coefficient "k" shown in Formula 1 that when a change in the mutual inductance M is small, changes in L1 and L2 dominate over the coupling coefficient "k." In other words, the coupling coefficient "k" vary significantly since the denominator of Formula 1 becomes smaller due to the decrease of the self inductance L1 and the self inductance L2.

According to the above-described embodiment, since the inter-coil region 51 (the annular portion 19a1 and the annular portion 18b1) is formed of a material having a low iron content, magnetic saturation tends to advance in the inter-coil region 51. For this reason, the magnetic coupling coil element 1 in the above embodiment has larger self-inductance L1 and self-inductance L2 as compared with the conventional magnetic coupling coil element that does not have the region where magnetic saturation tends to advance between the coils. Whereas when the magnetic saturation advances in the inter-coil region 51, the magnetic flux 41a interlinked only with the coil conductor 25a and the magnetic flux 41b interlinked only with the coil conductor 25b decrease, but the mutual inductance M interlinked with both the coil conductor 25a and the coil conductor 25b increases. Thus, in the magnetic coupling coil element 1 according to the above embodiment, by promoting the progress of the magnetic saturation in the inter-coil region 51, the self inductance L1 of the coil conductor 25a and the self inductance L2 of the coil conductor 25b can be greatly reduced while the mutual inductance M between the coil conductor 25a and the coil conductor 25b can be increased. As is apparent from the definition of the coupling coefficient represented by Formula 1, it is possible to increase the change in the coupling coefficient "k" compared to a conventional magnetic coupling coil element that does not promote the magnetic saturation between the coil conductors.

In the above-described embodiment, by making the saturation magnetic flux density of the first region 51 lower than the regions of the magnetic base body 10 other than the first region, it is possible to promote the magnetic saturation in the first region 51 occurring when current flows in the coil conductor 25a and the coil conductor 25b. Therefore, in the magnetic coupling coil element 1, by lowering the saturation magnetic density in the first region 51, it is possible to increase the decreasing rate of the self inductance L1 of the coil conductor 25a and the self inductance L2 of the coil conductor 25b when current is applied to the coil conductor 25a and the coil conductor 25b compared with a similar coil element that does not have such a low saturation magnetic flux density region. Moreover, when magnetic saturation occurs in the first region 51, the ratio of the magnetic flux 41a and the magnetic flux 41b decrease whereas the ratio of the magnetic flux 42 contributing to the coupling between the coil conductor 25a and the coil conductor 25b increases. Consequently it is possible to increase the increasing rate of the absolute value of the mutual inductance M between the coils. The changes in L1, L2 and M increase the coupling coefficient "k" when the current is applied in the magnetic coupling coil element 1, as understood from Formula 1.

Next, a description is given of an example of a manufacturing method of the magnetic coupling coil element 1. The magnetic coupling coil element 1 can be manufactured by, for example, a lamination process. First, the coil unit 1a and the coil unit 1b are fabricated Magnetic sheets (hereinafter referred to as "first magnetic sheets") that serve as the magnetic films constituting the upper cover layer 18a, the magnetic films 11a1 to 11a7, the magnetic films 11b1 to 11b7, and the magnetic films constituting the lower cover layer 19b respectively are fabricated. These first magnetic sheets are formed of, for example, ferrite, a soft magnetic alloy, or any other magnetic material. The first magnetic sheets are hereunder described as they are formed of a magnetic material containing a soft-magnetic alloy.

To fabricate the first magnetic sheet formed of the magnetic material containing a soft magnetic alloy, first, a binder resin and a solvent are added to particles of soft magnetic metal made of an Fe—Si alloy, an Fe—Ni alloy, an Fe—Co alloy, an Fe—Cr—Si alloy, an Fe—Si—Al alloy, an Fe—Si—B—Cr alloy, or any other soft magnetic alloy to prepare a slurry. The slurry is then applied to a surface of a plastic base film. The applied slurry is dried and the first magnetic sheet is obtained.

Next, magnetic sheets (hereinafter referred to as "second magnetic sheets") that serve as the magnetic films constituting the lower cover layer 19a and the upper cover layer 18a are fabricated. The annular portion 19a1 is provided in the lower cover layer 19a and the annular portion 18b1 is provided in the upper cover layer 18a so that magnetic sheets (hereinafter referred to as "annular potion sheets") that serve as the annular portion 19a1 and the annular portion 18b1) are first fabricated. The annular potion sheets can be obtained by adding a binder resin and a solvent to particles of soft magnetic alloy having a higher iron content than the soft magnetic metal particles contained in the first magnetic sheet to form a slurry, applying this slurry onto a surface of a plastic base film, and drying the applied slurry. The annular portion sheets obtained in this manner have a lower iron content than the first magnetic sheet. Next, the annular portion sheet is cut to have an annular shape corresponding to the coil conductor 25a in plan view. The same slurry as the slurry used to make the first magnetic sheet is subsequently applied on the periphery and in the annular portion of the annular sheet, and the applied slurry is dried to obtain the second magnetic sheets that serves as the magnetic film constituting the lower cover layer 19a and the upper cover layer 18a.

Next, through-holes are formed at predetermined positions in the first magnetic sheets that serve as the magnetic films 11a1 to 11a6 and the first magnetic material sheets that serve as the magnetic films 11b1 to 11b6 such that the holes penetrate through the first magnetic sheets in the T-axis direction.

Conductive paste is printed by screen printing on an upper surface of each of the first magnetic sheets that serve as the magnetic films 11a1 to 11a7 and an upper surface of each of the first magnetic sheets that serve as the magnetic films 11b1 to 11b7 to form the conductive pattern on each first magnetic sheet. The conductive paste is further filled in each through-hole formed in the first magnetic sheets. The conductive patterns formed on the first magnetic sheets that serve as the magnetic film 11a1 to 11a7 are the conductor patterns 25a1 to 25a7, respectively, and the metal filled in the through holes serve as the vias Va1 to Va6. The conductive patterns formed on the magnetic sheets of the magnetic films 11b1 to 11b7 are the conductive patterns 25b1 to 25b7, respectively, and the metal filled in the through holes serve as the vias Vb1 to Vb6. The conductive patterns and the vias can be formed by any various known methods instead of the screen printing.

Next, the first magnetic sheets that serve as the magnetic films 11a1 to 11a7 are laminated to obtain a first coil laminate. The first magnetic sheets that serve as the magnetic films 11a1 to 11a7 are laminated such that the conductive patterns 25a1 to 25a7 formed on the magnetic sheets are each electrically connected to the adjacent conductive patterns through the vias Va1 to Va6. Similarly, the first magnetic sheets that serve as the magnetic films 11b1 to 11b7 are laminated to obtain a second coil laminate. The first magnetic sheets that serve as the magnetic films 11b1 to 11b7 are laminated such that the conductive patterns 25b1 to 25b7 formed on the magnetic sheets are each electrically connected to the adjacent conductive patterns through the vias Vb1 to Vb6.

A plurality of the first magnetic sheets are laminated to form a first upper laminate that serves as the upper cover layer 18a. Further, a plurality of the first magnetic sheets are laminated to form a second lower laminate that serves as the lower cover layer 19b.

Furthermore, a plurality of the second magnetic sheets are laminated to form a second upper laminate that serves as the lower cover layer 19a. A plurality of the second magnetic sheets are laminated to form a first lower laminate that serves as the upper cover layer 18b.

Subsequently, the second lower laminate, the second coil laminate, the first lower laminate, the second upper laminate, the first coil laminate, and the first upper laminate are stacked in the stated order from the negative side of the T axis toward the positive side, and the stacked laminates are thermocompressed by a pressing machine to obtain a main body laminate. Alternatively, the main body laminate may be prepared without forming the second lower laminate, the second coil laminate, the second upper laminate, the first lower laminate, the first coil laminate, and the first upper laminate. Instead, all the magnetic sheets may be stacked in the above order, and the stack of the magnetic sheets may be collectively thermocompressed to bond each other.

Next, the main body laminate is diced in a desired size by using a cutter such as a dicing machine or a laser processing machine to obtain a chip laminate. Next, the chip laminate is subjected to degreasing, and the chip laminate thus degreased is heat-treated. Polishing treatment such as barrel polishing is performed on the end portions of the chip laminate, if necessary.

The conductive paste is subsequently applied to both end portions of the chip laminate to form the external electrode 21, the external electrode 22, the external electrode 23, and the external electrode 24. At least one of a solder barrier layer and a solder wetting layer may be formed on the external electrode 21, the external electrode 22, the external electrode 23, and the external electrode 24 as necessary. Through the above described processes, the magnetic coupling coil element 1 is obtained.

Some of the steps included in the above manufacturing method can be omitted as appropriate. In the method of manufacturing the magnetic coupling coil element 1, a step(s) not explicitly described herein may be performed as necessary. Some of the steps included in the above-described method of manufacturing the magnetic coupling coil element 1 may be carried out in a different order as needed, without departing from the spirit of the present invention. Some of the steps included in the above-described method of manufacturing the magnetic coupling coil element 1 may be performed simultaneously or in parallel, if possible.

Alternatively each magnetic films included in the magnetic coupling coil element 1 may be formed of an insulating sheet obtained by temporarily curing a resin in which filler particles of any type may are dispersed. There is no need to degrease such an insulating sheet.

The magnetic coupling coil element 1 may be manufactured by a slurry build method or any other known method Since the magnetic coupling coil element 1 is fabricated by the lamination process, it is easier to downsize than conventional assembled coupled inductors.

Figure 5:
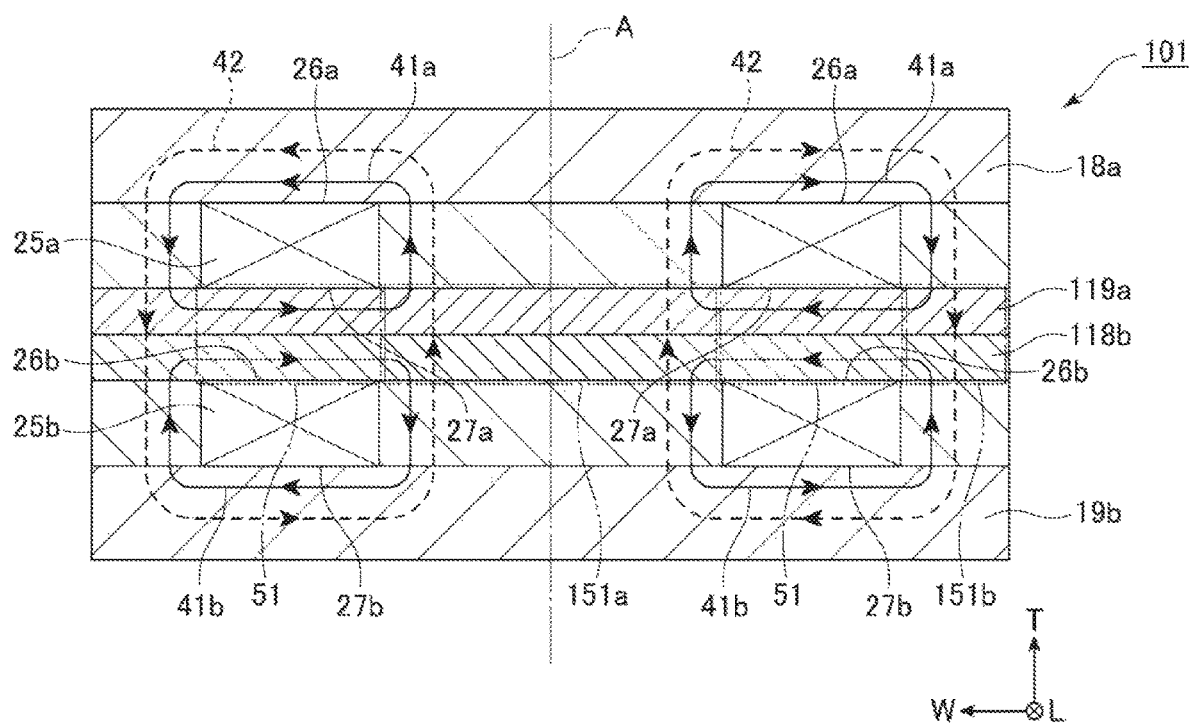
FIG. 5 is a schematic sectional view (TW section) of a magnetic coupling coil element according to another embodiment of the present invention.

Another embodiment of the invention will be described with reference to FIG. 5. FIG. 5 is a schematic sectional view of a magnetic coupling coil element 101 according to another embodiment of the invention. The magnetic coupling coil element 101 shown in FIG. 5 differs from the magnetic coupling coil component 1 in that the intermediate magnetic layer includes a lower cover layer 119a and an upper cover layer 118b. In the lower cover layer 119a and the upper cover layer 118b, a region inside the coil conductor 25a and the coil conductor 25b may be herein referred to as a core region 151a, and a region outside the coil conductor 25a and the coil conductor 25b may be referred to as an outer peripheral region 151b. The core region 151a and the outer peripheral region 151b in the intermediate magnetic layer (the lower cover layer 119a and the upper cover layer 118b) are examples of a second region in the intermediate magnetic layer. In one embodiment, the intermediate magnetic layer is configured such that saturation magnetic flux densities in regions therein other than the first region 51, the core region 151a, and the outer peripheral region 151b are lower than the saturation magnetic flux density in the areas other than the intermediate magnetic layer of the magnetic base body 10. The intermediate magnetic layer is formed by laminating the second magnetic sheets described above.

In the magnetic coupling coil element 101, when current flows through the coil conductor 25a and the coil conductor 25b in the direction in which they are negatively coupled to each other, the self-inductance L1 of the coil conductor 25a and the self-inductance L2 of the conductor 25b decrease as the intensity of magnetization in the intermediate magnetic layer increases. Moreover, since the magnetic flux 42 increases while the magnetic flux 41a and the magnetic flux 41b decrease when the intensity of the magnetization in the intermediate magnetic layer increases, the absolute value of the mutual inductance M between the coil conductor 25a and the coil conductor 25b is increased. Therefore, the coupling coefficient "k" can be increased when current is applied to the coil conductor 25a and the coil conductor 25b on the same principle as described for the magnetic coupling coil element 101.

The dimensions, materials, and arrangements of the various constituent elements described herein are not limited to those explicitly described in the embodiments, and the various constituent elements can be modified to have any dimensions, materials, and arrangements within the scope of the present invention. Furthermore, constituent elements not explicitly described herein can also be added to the embodiments described, and it is also possible to omit some of the constituent elements described in the embodiments.

Herein, when a layer is provided "over" or "under" another layer, the layer may be in direct contact with the other layer or indirectly in contact with the other layer via another magnetic film. For example, the upper cover layer 18a may be in direct contact with the upper surface of the upper magnetic layer 20a, or may be indirectly in contact with the upper surface of the upper magnetic layer 20a via another magnetic film. Similarly, the lower cover layer 19a may be in direct contact with the lower surface of the upper magnetic layer 20a, or may be indirectly in contact with the lower surface of the upper magnetic layer 20a via another magnetic film.

What is claimed is:

1. A magnetic coupling coil element, comprising:
    a magnetic base body including an intermediate magnetic layer, a first magnetic layer disposed over the intermediate magnetic layer, and a second magnetic layer disposed under the intermediate magnetic layer;
    a first coil conductor provided in the first magnetic layer; and
    a second coil conductor provided in the second magnetic layer,
    wherein the intermediate magnetic layer has a saturation magnetic flux density lower than saturation magnetic flux densities of the first magnetic layer and the second magnetic layer in a first region that overlaps with the first coil conductor and the second coil conductor in plan view.

2. The magnetic coupling coil element of claim 1, wherein the intermediate magnetic layer has a lower iron content in the first region than the first magnetic layer and the second magnetic layer.

3. The magnetic coupling coil element of claim 1, wherein the intermediate magnetic layer has a saturation magnetic flux density lower than saturation magnetic flux densities of the first magnetic layer and the second magnetic layer also in a second region different from the first region.

4. The magnetic coupling coil element of claim 3, wherein the intermediate magnetic layer has a lower iron content in the second region than the first magnetic layer and the second magnetic layer.

5. The magnetic coupling coil element of claim 1 further comprising:
    a first cover layer disposed over the first magnetic layer and a second cover layer disposed under the second magnetic layer,
    wherein the intermediate magnetic layer has a saturation magnetic flux density lower than saturation magnetic flux densities of the first cover layer and the second cover layer in the first region that overlaps with the first coil conductor and the second coil conductor in plan view.

6. A circuit board comprising the magnetic coupling coil element of claim 1.

7. An electronic device comprising the circuit board of claim 6.

8. A method of manufacturing the magnetic coupling coil element of claim 1.

9. The method of claim 8, wherein the first magnetic layer and the second magnetic layer are both formed by a lamination process.

* * * * *